(12) United States Patent
Nakayama (10) Patent No.: US 8,801,152 B2
(45) Date of Patent: Aug. 12, 2014

(54) PIEZOELECTRIC ELEMENT, PIEZOELECTRIC ACTUATOR, LIQUID EJECTING HEAD, LIQUID EJECTING APPARATUS, AND METHOD FOR PRODUCING PIEZOELECTRIC ELEMENT

(71) Applicant: Seiko Epson Corporation, Tokyo (JP)

(72) Inventor: Masao Nakayama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/940,123

(22) Filed: Jul. 11, 2013

(65) Prior Publication Data

US 2013/0300806 A1  Nov. 14, 2013

Related U.S. Application Data

(63) Continuation of application No. 12/860,741, filed on Aug. 20, 2010, now Pat. No. 8,567,918.

(30) Foreign Application Priority Data

Aug. 21, 2009  (JP) ................................. 2009-191723

(51) Int. Cl.
*B41J 2/045* (2006.01)
*G01D 15/00* (2006.01)
*G11B 5/127* (2006.01)

(52) U.S. Cl.
USPC .............................................. 347/68; 216/27

(58) Field of Classification Search
USPC ................................................ 347/68, 70–72
See application file for complete search history.

(56) References Cited

U.S. PATENT DOCUMENTS

| 6,336,717 B1 * | 1/2002 | Shimada et al. ................. 347/71 |
| 8,079,677 B2 * | 12/2011 | Morozumi et al. ............. 347/71 |
| 2005/0248232 A1 * | 11/2005 | Itaya et al. ..................... 310/320 |
| 2006/0290747 A1 | 12/2006 | Shimada et al. |

FOREIGN PATENT DOCUMENTS

| JP | 2005-088441 A | 4/2005 |
| JP | 2005-119199 A | 5/2005 |
| JP | 2009-078439 A | 4/2009 |
| JP | 2010-003971 A | 1/2010 |
| WO | 2005/028207 A1 | 3/2005 |

\* cited by examiner

*Primary Examiner* — Lisa M Solomon
(74) *Attorney, Agent, or Firm* — Kilpatrick Townsend & Stockton LLP (57) ABSTRACT

A piezoelectric element includes a substrate; a first conductive layer disposed on or above the substrate; a piezoelectric layer covering a top and a side of the first conductive layer; a relaxing layer disposed on or above the piezoelectric layer and along an edge of a top surface of the piezoelectric layer; and a second conductive layer covering at least the relaxing layer and the piezoelectric layer.

1 Claim, 7 Drawing Sheets

PIEZOELECTRIC ELEMENT, PIEZOELECTRIC ACTUATOR, LIQUID EJECTING HEAD, LIQUID EJECTING APPARATUS, AND METHOD FOR PRODUCING PIEZOELECTRIC ELEMENT

This application is a continuation of U.S. patent application Ser. No. 12/860,741, filed Aug. 20, 2010, which claims the priority to Japanese Patent Application No. 2009-191723, filed on Aug. 21, 2009, the entire disclosures of which are incorporated by reference herein.

BACKGROUND

1. Technical Field

The present invention relates to a piezoelectric element, a piezoelectric actuator, a liquid ejecting head, a liquid ejecting apparatus, and a method for producing such a piezoelectric element.

2. Related Art

A piezoelectric element includes a structure in which a piezoelectric material is sandwiched between two electrodes. Since a piezoelectric element includes such a structure, deformation of the piezoelectric element such as expansion and contraction can be caused by the application of an electric field to the piezoelectric material. A typical material of a piezoelectric material is lead zirconate titanate or the like.

A piezoelectric element is used as a piezoelectric actuator for a liquid ejecting head or the like. The performance of a piezoelectric element can be degraded by degradation of a piezoelectric material. When a piezoelectric material is an oxide such as lead zirconate titanate, the contact between water and the piezoelectric material causes, for example, an increase in leakage current generated between two electrodes, resulting in degradation of the reliability of the piezoelectric element.

To suppress the contact between a piezoelectric material and water, the piezoelectric material is covered with a barrier film. JP-A-2005-119199 discloses a liquid ejecting head having a structure in which a piezoelectric material is covered with an insulation film. In addition, JP-A-2005-088441 discloses a liquid ejecting head in which a piezoelectric material is covered with an electrode and the electrode is made to function also as a barrier film to suppress the contact between the piezoelectric material and water.

SUMMARY

However, in the case where a piezoelectric material is covered with an insulation film or the like, when the insulation film has high rigidity, deformation of the piezoelectric element such as expansion and contraction is suppressed and the action performance of the piezoelectric element is sometimes degraded.

When a piezoelectric material is covered with an electrode, there are cases where stress upon film formation of the electrode remains inside the electrode. When such stress remains in the electrode, there are cases where cracking or the like is generated in the electrode in a region where the residual stress is concentrated and the water barrier property of the electrode becomes insufficient.

The inventor of the invention has accomplished the invention on the basis of a finding that residual stress in an electrode layer tends to be concentrated to bending portions of the electrode.

An advantage of some aspects of the invention is that a piezoelectric element having high reliability is provided.

The invention has been accomplished to overcome at least a portion of the above-described problems. The invention can be embodied as the following embodiments or application examples.

Application Example 1

According to an aspect of the invention, a piezoelectric element includes:
a substrate;
a first conductive layer disposed on or above the substrate;
a piezoelectric layer covering a top and a side of the first conductive layer;
a relaxing layer disposed on or above the piezoelectric layer and along an edge of a top surface of the piezoelectric layer; and
a second conductive layer covering at least the relaxing layer and the piezoelectric layer.

In such a piezoelectric element, the piezoelectric material of the piezoelectric layer is covered with the second conductive layer and the portions of the second conductive layer where stress is concentrated are separated from regions where the piezoelectric material is covered. Accordingly, in the piezoelectric element of the application example 1, the contact between water in the atmosphere such as the air and the piezoelectric material is suppressed and the piezoelectric material is less likely to be degraded. Thus, the piezoelectric element has high reliability.

Note that, in the description of embodiments of the invention, the term "on or above" is used, for example, in the following manner: a "certain thing (hereafter, referred to as "B")" is formed "on or above" another "certain thing (hereafter, referred to as "A"). In the description of embodiments of the invention, the term "on or above" is used such that this example encompasses the case where B is formed directly on A and the case where B is formed on A with another layer or the like between B and A.

Application Example 2

In the piezoelectric element according to Application example 1, the relaxing layer preferably includes a first side surface connecting a top surface of the relaxing layer and a side surface of the piezoelectric layer; and a second side surface connecting the top surface of the relaxing layer and the top surface of the piezoelectric layer; and
an inclination of the second side surface with respect to the top surface of the relaxing layer is preferably smaller than an inclination of the first side surface with respect to the top surface of the relaxing layer.

In such a piezoelectric element, residual stress is less likely to be generated, in the second conductive layer, in the portion where the second side surface of the relaxing layer and the top surface of the piezoelectric layer are connected to each other. Thus, the piezoelectric element can have higher reliability.

Application Example 3

The piezoelectric element according to Application example 1 or 2, preferably further includes:
a third conductive layer provided between the piezoelectric layer and the second conductive layer so as to cover the top surface of the piezoelectric layer,
wherein the relaxing layer is preferably disposed on or above the third conductive layer.

In such a piezoelectric element, upon the formation of the relaxing layer, the third conductive layer serves as an etching stopper and the upper portion of the piezoelectric layer can be protected. Accordingly, the contact between the piezoelectric layer and water or the like can be further suppressed and the piezoelectric element can have higher reliability.

Application Example 4

In the piezoelectric element according to any one of Application examples 1 to 3,
a material of the relaxing layer preferably includes at least one selected from aluminum oxide, titanium oxide, silicon nitride, and lanthanum nickel oxide.

Such a piezoelectric element includes the relaxing layer that is less likely to pass water therethrough. Accordingly, the piezoelectric material is much less likely to be degraded and the piezoelectric element can have higher reliability.

Application Example 5

In the piezoelectric element according to any one of Application examples 1 to 4,
the piezoelectric element preferably includes a plurality of multilayer structures including the first conductive layers, the piezoelectric layer, the relaxing layer, and the second conductive layer, and
the first conductive layers preferably serve as individual electrodes corresponding to the plurality of multilayer structures and the second conductive layer preferably serves as a common electrode through the plurality of multilayer structures.

In such a piezoelectric element, since the second conductive layer serves as a common electrode, the piezoelectric element has high reliability as in the above-described piezoelectric elements, is small, and can be readily produced.

Application Example 6

Another aspect of the invention is a method for producing a piezoelectric element including:
forming a first conductive layer on or above a substrate;
forming a piezoelectric layer on or above the substrate and the first conductive layer;
forming a relaxing layer on or above the piezoelectric layer;
performing first patterning in which the relaxing layer and the piezoelectric layer are patterned;
performing second patterning in which the patterned relaxing layer is further patterned; and
forming a second conductive layer so as to cover the piezoelectric layer and the relaxing layer,
wherein, in the second patterning, the relaxing layer is patterned so as to extend along an edge of a top surface of the piezoelectric layer.

According to such a method for producing a piezoelectric element, a piezoelectric element can be produced such that the concentration of stress is not caused in the second conductive layer. Thus, piezoelectric elements having high reliability can be readily produced.

Application Example 7

Another aspect of the invention is a piezoelectric actuator including the piezoelectric element according to any one of Application examples 1 to 5,
wherein the substrate has flexibility and is deformed by action of the piezoelectric layer.

Since such a piezoelectric actuator includes the piezoelectric element, the piezoelectric actuator can have high reliability.

Application Example 8

Another aspect of the invention is a liquid ejecting head including:
the piezoelectric actuator according to Application example 7; and
a pressure chamber whose volume is changed by action of the piezoelectric actuator, the pressure chamber being in communication with a nozzle opening.

Since such a liquid ejecting head includes the piezoelectric actuator, the liquid ejecting head can have high reliability.

Application Example 9

Another aspect of the invention is a liquid ejecting apparatus including the liquid ejecting head according to Application example 8.

Since such a liquid ejecting apparatus includes the liquid ejecting head, the liquid ejecting apparatus can have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the drawings. However, the embodiments described below are mere examples of the invention. The invention is not restricted to the embodiments described below and encompasses various modifications carried out without departing from the spirit and scope of the invention.

1. Piezoelectric Element

Figure 1:
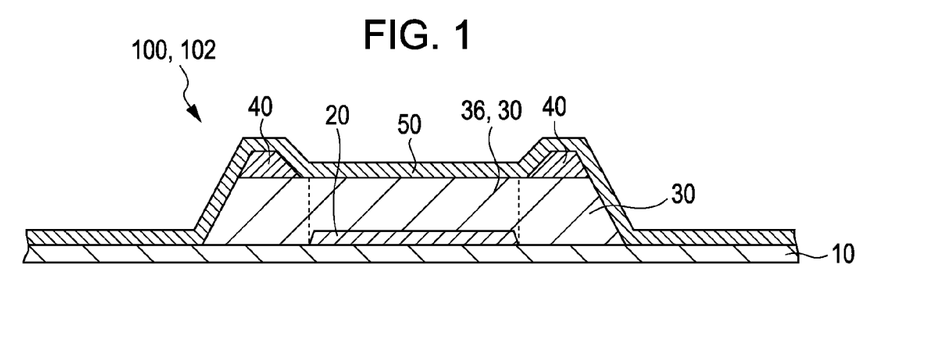
FIG. 1 is a schematic sectional view of a piezoelectric element 100 according to an embodiment.
Figure 2:
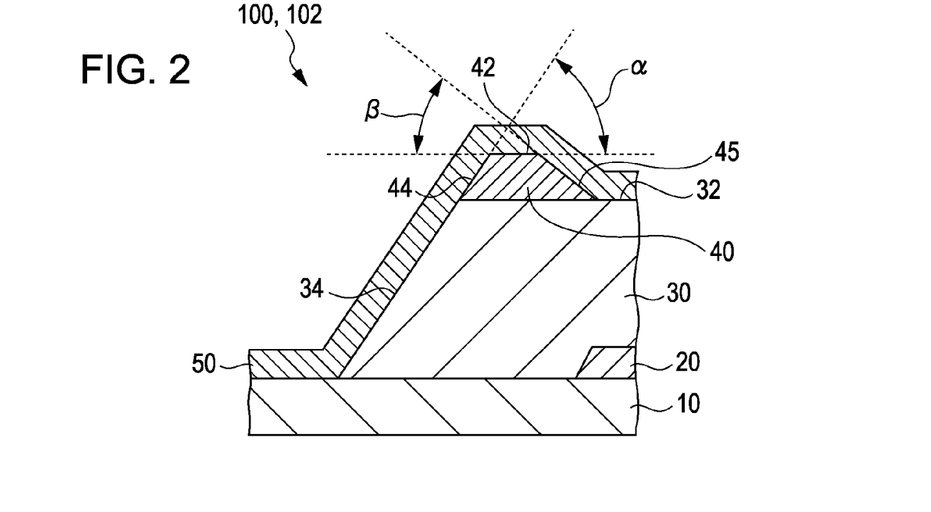
FIG. 2 is a schematic sectional view of a main portion of a piezoelectric element 100 according to an embodiment.

FIG. 1 is a schematic sectional view of a piezoelectric element 100 according to an embodiment of the invention. FIG. 2 is a schematic sectional view of a main portion of the piezoelectric element 100.

The piezoelectric element 100 according to the embodiment includes a substrate 10, a first conductive layer 20, a piezoelectric layer 30, a relaxing layer 40, and a second conductive layer 50.

The substrate 10 may be, for example, a flat plate formed of an electrically conductive material, a semiconductor material, or an insulation material. The substrate 10 may have a monolayer structure or a structure in which a plurality of layers are stacked. The internal structure of the substrate 10 is not restricted as long as the upper surface of the substrate 10 is flat. For example, the substrate 10 may have a structure having an internal space or the like. For example, in a case where pressure chambers and the like are formed under the substrate 10 as in a liquid ejecting head described below, the substrate 10 and a plurality of components under the substrate 10 may be collectively seen as the substrate 10.

The substrate 10 may be, for example, a vibrating plate that has flexibility and can be deformed (bent) by the action of the piezoelectric layer 30. In this case, the piezoelectric element 100 serves as a piezoelectric actuator 102 including a vibrating plate, the first conductive layer 20, the piezoelectric layer 30, the relaxing layer 40, and the second conductive layer 50. Here, "the substrate 10 has flexibility" means that the substrate 10 can be bent. When a vibrating plate is used as the substrate 10, the substrate 10 in the piezoelectric actuator 102 used in a liquid ejecting head is bent to a degree at which the volume of pressure chambers can be changed by a volume equivalent to the volume of liquid ejected.

When the substrate 10 is a vibrating plate, examples of a material of the substrate 10 include inorganic oxides such as zirconium oxide ($ZrO_2$), silicon nitride, and silicon oxide; and alloys such as stainless steel. Of these, in particular, a material of the substrate 10 (vibrating plate) is preferably zirconium oxide in view of chemical stability and rigidity. In this case, the substrate 10 may have a multilayer structure in which two or more of the materials listed above are stacked.

In the present embodiment, hereafter, a case where the substrate 10 is a vibrating plate and composed of zirconium oxide will be described as an example. Accordingly, the piezoelectric element 100 is substantially the same as the piezoelectric actuator 102 including a vibrating plate that has flexibility and can be deformed (bent) by the action of the piezoelectric layer 30. Thus, in the following description, the piezoelectric element 100 and the piezoelectric actuator 102 is interchangeable.

The thickness of the substrate 10 (vibrating plate) can be optimally selected in accordance with properties of a material of the substrate 10 such as modulus of elasticity. The thickness of the substrate 10 can be, for example, 200 nm or more and 2000 nm or less. When the thickness of the substrate 10 is less than 200 nm, there may be a case where mechanical output such as vibration is not readily output. When the thickness of the substrate 10 is more than 2000 nm, there may be a case where vibration or the like does not occur.

The first conductive layer 20 is formed on or above the substrate 10. Examples of a material of the first conductive layer 20 include various metals such as nickel, iridium, and platinum; electrically conductive oxides of such metals (for example, iridium oxide); an oxide complex of strontium and ruthenium ($SrRuO_x$:SRO); and an oxide complex of lanthanum and nickel ($LaNiO_x$:LNO). The first conductive layer 20 may have a monolayer structure composed of a material selected from the above-listed materials or a multilayer structure in which a plurality of materials are stacked. In addition, for example, a bonding layer or the like may be formed between the first conductive layer 20 and the substrate 10. In this case, the bonding layer may be, for example, a titanium layer. The first conductive layer 20 may have a thickness of 50 nm or more and 300 nm or less. A function of the first conductive layer 20 is to serve as one electrode (a lower electrode formed under the piezoelectric layer 30) of the electrodes for applying a voltage to the piezoelectric layer 30.

The piezoelectric layer 30 is formed so as to cover the top and the sides of the first conductive layer 20. In the example illustrated in FIGS. 1 and 2, the piezoelectric layer 30 is formed so as to cover the top surface and the side surfaces of the first conductive layer 20 and a top surface 12 of the substrate 10. Another layer may be formed between the piezoelectric layer 30 and the first conductive layer 20. In this case, such an another layer may be, for example, an orientation controlling layer (for example, a titanium layer) for controlling the orientation of the crystals of the piezoelectric layer 30. The piezoelectric layer 30 may have a thickness of, for example, 300 nm or more and 3000 nm or less. When the piezoelectric layer 30 has a thickness out of this range, there may be a case where expansion and contraction necessary for deforming the substrate 10 are not provided.

The piezoelectric layer 30 includes a top surface 32 and side surfaces 34 connected to the top surface 32. In the example illustrated in FIG. 2, the top surface 32 of the piezoelectric layer 30 is a flat surface (level surface) and is substantially parallel to the top surface of the substrate 10. However, the top surface 32 of the piezoelectric layer 30 is not necessarily restricted to a flat surface and may have a projected profile corresponding to the profile of the first conductive layer 20 serving as the underlying layer. The side surfaces 34 of the piezoelectric layer 30 are surfaces with which the top surface 32 of the piezoelectric layer 30 and the top surface of the substrate 10 are connected to each other. The side surfaces 34 of the piezoelectric layer 30 may be constituted by a single flat surface or a plurality of flat surfaces. Alternatively, the side surfaces 34 of the piezoelectric layer 30 may include a curved surface.

The piezoelectric layer 30 is composed of a piezoelectric material. Accordingly, the piezoelectric layer 30 can be deformed under the application of an electric field by the first conductive layer 20 and the second conductive layer 50 (described below). This deformation allows the substrate 10 to bend or vibrate. Note that, in this specification, a region of the piezoelectric layer 30 in which the second conductive layer 50 overlies the first conductive layer 20 in plan view is referred to as a driving region 36.

A material of the piezoelectric layer 30 is preferably a perovskite oxide represented by a general formula $ABO_3$ (for example, A contains Pb and B contains Zr and Ti). Specific examples of such a material include, lead zirconate titanate ($Pb(Zr,Ti)O_3$) (hereafter, sometimes abbreviated as "PZT"); lead zirconate titanate niobate ($Pb(Zr,Ti,Nb)O_3$) (hereafter, sometimes abbreviated as "PZTN"); barium titanate ($BaTiO_3$); and potassium sodium niobate ($(K,Na)NbO_3$). Of these, in particular, PZT and PZTN are preferred as a material of the piezoelectric layer 30 because of good piezoelectric characteristics.

The relaxing layer 40 is formed on or above the piezoelectric layer 30. In the example illustrated in FIGS. 1 and 2, the relaxing layer 40 is formed on the top surface 32 of the piezoelectric layer 30. As illustrated in FIG. 2, the relaxing layer 40 is formed along edges of the top surface 32 of the piezoelectric layer 30. In addition, the relaxing layer 40 includes a first side surface 44 continuously connected to the side surface 34 of the piezoelectric layer 30; a top surface 42 that is continuously connected to the first side surface 44 and substantially parallel to the substrate 10; and a second side surface 45 that is continuously connected to the top surface 42 and, in plan view, connected to the top surface 32 of the piezoelectric layer 30 within the piezoelectric layer 30. More preferably, the relaxing layer 40 is formed so as not to overlie the driving region 36 of the piezoelectric layer 30. Specifically, the relaxing layer 40 is preferably formed outside a region in which the second conductive layer 50 overlies the first conductive layer 20 and along edges of the top surface 32. When the relaxing layer 40 is formed in such a configuration, constraint of the mechanical action (deformation or the like) of the piezoelectric layer 30 by the relaxing layer 40 can be further reduced.

A function of the relaxing layer 40 is to impart a shape to the second conductive layer 50 in edges of the top surface 32 of the piezoelectric layer 30, the shape being less likely to have residual stress (described below). Another function of the relaxing layer 40 is to impart a shape to the second conductive layer 50 in a portion where the second side surface 45 of the relaxing layer 40 and the top surface 32 of the piezoelectric layer 30 are connected to each other, the shape being less likely to have residual stress. Another function of the relaxing layer 40 is to separate a portion of the second conductive layer 50 from the piezoelectric layer 30, the portion being likely to be damaged. Still another function of the relaxing layer 40 is to suppress the contact between the piezoelectric layer 30 and water.

A material of the relaxing layer 40 is not particularly restricted but the material may be at least one selected from aluminum oxide, silicon oxide, titanium oxide, iridium oxide, silicon nitride, titanium nitride, lanthanum nickel oxide (LNO), platinum, iridium, and aluminum. Of these, a material of the relaxing layer 40 preferably contains at least one selected from aluminum oxide, titanium oxide, silicon nitride, and LNO in view of at least one of a high water-barrier property and high selectivity in dry etching of the relaxing layer 40 and another member. The relaxing layer 40 may have a monolayer structure composed of a material selected from the above-listed materials or a multilayer structure in which a plurality of materials are stacked.

The relaxing layer 40 is formed in portions inside with respect to edges of the top surface 32 of the piezoelectric layer 30, the portions being along the edges. In edges where the top surface 32 and the side surface 34 of the piezoelectric layer 30 of the piezoelectric element 100 are connected to each other, the presence of the relaxing layer 40 relaxes bending, in the thickness direction, of the second conductive layer 50 formed so as to cover the piezoelectric layer 30 and the relaxing layer 40. The inclination of the second side surface 45 of the relaxing layer 40 with respect to the top surface 42 of the relaxing layer 40 can be made smaller than the inclination of the first side surface 44 of the relaxing layer 40 with respect to the top surface 42 of the relaxing layer 40. In this case, bending, in the thickness direction, of the second conductive layer 50 can be relaxed in edge portions where the second side surface 45 of the relaxing layer 40 and the top surface 32 of the piezoelectric layer 30 are connected to each other.

In the example illustrated in FIG. 2, the section of the relaxing layer 40 has a structure in which the top surface 42 and the bottom surface of the relaxing layer 40 are parallel to each other and the first side surface 44 is inclined at angle $\alpha$ (acute angle side) with respect to the top surface 42 of the relaxing layer 40. Additionally, in this example illustrated in FIG. 2, the first side surface 44 of the relaxing layer 40 on the same side as the side surface 34 of the piezoelectric layer 30 has the same inclination as the side surface 34 of the piezoelectric layer 30. Alternatively, there may be a case where the inclination of the first side surface 44 is not the same as the inclination of the side surface 34 of the piezoelectric layer 30. In this case, the inclination of the first side surface 44 of the relaxing layer 40 is smaller than the inclination of the side surface 34 of the piezoelectric layer 30. The second side surface 45 of the relaxing layer 40 is a flat surface and has a shape inclined at angle $\beta$ (acute angle side) with respect to the top surface 42 of the relaxing layer 40. In this case, the relationship between the angles $\alpha$ and $\beta$ satisfies $\alpha > \beta$. Accordingly, in the example illustrated in FIG. 2, bending, in the thickness direction, of the second conductive layer 50 is relaxed in edge portions where the second side surface 45 of the relaxing layer 40 and the top surface 32 of the piezoelectric layer 30 are connected to each other. The thickness of the relaxing layer 40 can be, for example, 20 nm or more and 200 nm or less.

The second conductive layer 50 is formed so as to cover the piezoelectric layer 30 and the relaxing layer 40. In the example illustrated in FIGS. 1 and 2, the second conductive layer 50 is formed so as to cover the top surface of the substrate 10, the side surface 34 of the piezoelectric layer 30, the first side surface 44 of the relaxing layer 40, the top surface 42 of the relaxing layer 40, the second side surface 45 of the relaxing layer 40, and the top surface 32 of the piezoelectric layer 30.

The thickness of the second conductive layer 50 is not particularly restricted as long as the second conductive layer 50 has sufficiently high water-barrier property and the second conductive layer 50 does not hamper the action of the piezoelectric element 100. The thickness of the second conductive layer 50 may be, for example, 20 nm or more and 200 nm or less. When the thickness of the second conductive layer 50 is less than 20 nm, there may be a case where the electrical resistance is increased or the water barrier property is insufficient. When the thickness of the second conductive layer 50 is more than 200 nm, there may be a case where the second conductive layer 50 hampers deformation of the piezoelectric element 100.

A function of the second conductive layer 50 is to serve as one electrode (an upper electrode formed on the piezoelectric layer 30) of the piezoelectric element 100 to form a pair of electrodes together with the first conductive layer 20. Another function of the second conductive layer 50 is to suppress the contact between the piezoelectric material of the piezoelectric layer 30 and water coming from outside. Specifically, the second conductive layer 50 has a water barrier property with which water is less likely to pass through the second conductive layer 50. Accordingly, degradation caused by water is suppressed in the piezoelectric material of the piezoelectric layer 30 covered with the second conductive layer 50.

A material of the second conductive layer 50 is not particularly restricted as long as the second conductive layer 50 has a sufficiently high water barrier property and has electrical conductivity. Examples of a material of the second conductive layer 50 include various metals such as nickel, iridium, platinum, and tungsten; electrically conductive oxides of such metals (for example, iridium oxide); SRO; and LNO.

The second conductive layer 50 may have a monolayer structure or a multilayer structure in which a plurality of layers are stacked.

The second conductive layer 50 can be formed by a method such as vapor deposition or sputtering. The second conductive layer 50 formed by such a method may have internal residual stress upon the formation of the second conductive layer 50. According to studies performed by the inventor of the invention, it has found that internal residual stress tends to be concentrated in portions where the second conductive layer 50 is bent in the thickness direction. The portions of the second conductive layer 50 where residual stress is concentrated tends to suffer from fracture such as a crack compared with the other portions of the second conductive layer 50. When the second conductive layer 50 is formed by a method such as vapor deposition or sputtering, the shape of the second conductive layer 50 obviously depends on the shape of the underlying base upon the formation of the second conductive layer 50.

As described above, the piezoelectric element 100 of the embodiment includes the relaxing layer 40. Accordingly, bending, in the thickness direction, of the second conductive layer 50 is relaxed in edge portions of the top surface 32 of the piezoelectric layer 30. Specifically, the degree of bending in the thickness direction is reduced in the second conductive layer 50 of the piezoelectric element 100 of the embodiment, in edge portions of the top surface 32 of the piezoelectric layer 30, compared with the case where the relaxing layer 40 is not formed. As a result, in the second conductive layer 50, the concentration of residual stress in edge portions of the top surface 32 of the piezoelectric layer 30 is reduced. Thus, in the second conductive layer 50, generation of cracks are suppressed in portions (edges of the top surface 32) where the top surface 32 and the side surface 34 of the piezoelectric layer 30 are connected to each other. By the presence of the relaxing layer 40, the portions where the second side surface 45 of the relaxing layer 40 and the top surface 32 of the piezoelectric layer 30 are connected to each other is formed as new bend portions of the second conductive layer 50. In the piezoelectric element 100 of the embodiment, as to the degree of bending of these bend portions, by decreasing the inclination of the second side surface 45 with respect to the top surface 42 of the relaxing layer 40, the concentration of stress in these portions is reduced. As a result, the degradation of the barrier property of the second conductive layer 50 in the portions is suppressed. As in the example illustrated in FIG. 2, when the side surface 34 of the piezoelectric layer 30 and the first side surface 44 of the relaxing layer 40 have the same inclination, the degree of bending in the portions of the second conductive layer 50 is considerably small and generation of residual stress in the portions can be further suppressed.

As described above, the piezoelectric element 100 of the embodiment includes the relaxing layer 40 and hence portions of the second conductive layer 50 that are considerably bent in the thickness direction can be positioned on or above the relaxing layer 40. Specifically, regions of the second conductive layer 50 where residual stress is concentrated are positioned so as to be apart from the piezoelectric layer 30. Accordingly, even when cracks are generated in the second conductive layer 50 by the concentration of residual stress, cracks are firstly generated in portions apart from the piezoelectric layer 30 compared with the other portions. Thus, when a material less likely to pass water therethrough is selected for forming the relaxing layer 40, the relaxing layer 40 can be used as a fail-safe component. Accordingly, in this case, even when the second conductive layer 50 has residual stress with which cracks are generated, the piezoelectric layer 30 can be sufficiently protected from degradation caused by water.

In the piezoelectric element 100 of the embodiment having been described so far, the concentration of residual stress in a region of the second conductive layer 50 where a piezoelectric material of the piezoelectric layer 30 is covered with the second conductive layer 50 is suppressed and portions of the second conductive layer 50 where residual stress is concentrated is made apart from the region covering the piezoelectric layer 30. By at least one of these features, in the piezoelectric element 100, the contact between water and the piezoelectric material is suppressed and the degradation of the piezoelectric material is suppressed. Therefore, the piezoelectric element 100 has high reliability.

2. Modification

Figure 3:
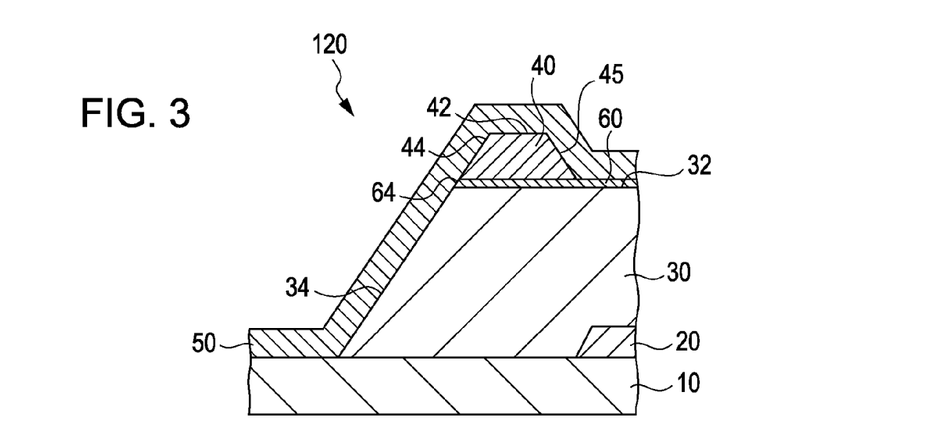
FIG. 3 is a schematic sectional view of a main portion of a piezoelectric element 120 according to a first modification.

FIG. 3 is a schematic sectional view of a main portion of a piezoelectric element 120 according to a first modification. Hereafter, in the piezoelectric element 120, components having substantially the same effect and function as components of the piezoelectric element 100 are denoted by like reference numerals and detailed descriptions of such components are omitted.

As illustrated in FIG. 3, the piezoelectric element 120 is the same as the piezoelectric element 100 except that the piezoelectric element 120 includes a third conductive layer 60 and the relaxing layer 40 is positioned on or above the third conductive layer 60.

The third conductive layer 60 is formed so as to cover the top surface 32 of the piezoelectric layer 30. The flat external shape of the third conductive layer 60 matches the shape of the top surface 32 of the piezoelectric layer 30. The thickness of the third conductive layer 60 can be made, for example, 5 nm or more and 50 nm or less.

The sectional shape of the third conductive layer 60 is not particularly restricted. In the example illustrated in FIG. 3, the section of the third conductive layer 60 has a shape in which a side surface 64 is inclined with respect to the top surface 32 of the piezoelectric layer 30. Additionally, in the example illustrated in FIG. 3, the side surface 64 of the third conductive layer 60 and the first side surface 44 of the relaxing layer 40 have the same inclination as the side surface 34 of the piezoelectric layer 30. Accordingly, the same advantageous effects as in the piezoelectric element 100 can be obtained in the piezoelectric element 120.

The third conductive layer 60 has smaller thickness than the piezoelectric layer 30 and the relaxing layer 40. Accordingly, in the first modification, it can be seen that the periphery of the top surface of the third conductive layer 60 matches the periphery of the top surface 32 of the piezoelectric layer 30. Thus, also in the first modification, the relaxing layer 40 is formed along edges of the top surface 32 of the piezoelectric layer 30 in plan view.

A function of the third conductive layer 60 is to protect the top surface 32 of the piezoelectric layer 30 upon the formation of the relaxing layer 40. Another function of the third conductive layer 60 is to serve as an etching stopper upon the patterning of the relaxing layer 40. Still another function of the third conductive layer 60 is to serve as a fail-safe component to suppress entry of water into the piezoelectric layer 30 even when a crack is generated in the second conductive layer 50 in a portion where the second side surface 45 of the relaxing layer 40 and the third conductive layer 60 are connected to each other. Examples of a material of the third conductive layer 60 include various metals such as nickel, iridium, and platinum.

The piezoelectric element 120 of the first modification includes the third conductive layer 60. Accordingly, the piezoelectric element 120 has not only the same features as in the piezoelectric element 100 but also a feature in which the piezoelectric layer 30 is not in contact with plasma, etchant, and the like upon the formation and the patterning of the relaxing layer 40. In addition, a material of the relaxing layer 40 and a material of the third conductive layer 60 can also be selected such that the etching rate of the material of the relaxing layer 40 is larger than that of the material of the third conductive layer 60. In this case, in the production of the piezoelectric element 120, the third conductive layer 60 can serve as an etching stopper upon the patterning of the relaxing layer 40. Accordingly, in such a case, the production of the piezoelectric element 120 can be facilitated. In addition, a material for forming the third conductive layer 60 and the thickness of the third conductive layer 60 can be selected such that the third conductive layer 60 has a water barrier property. In this case, even when a crack is generated in the second conductive layer 50 in a portion where the second side surface 45 of the relaxing layer 40 and the third conductive layer 60 are connected to each other, entry of water into the piezoelectric layer 30 can be prevented. Thus, a piezoelectric element that is more reliable can be provided. In addition, in this case, since the degree of bending of a portion where the second side surface 45 of the relaxing layer 40 and the third conductive layer 60 are connected to each other is not necessary to be considered, the sectional shape of the relaxing layer 40 is not particularly restricted and hence the production process can be facilitated.

Figure 4:
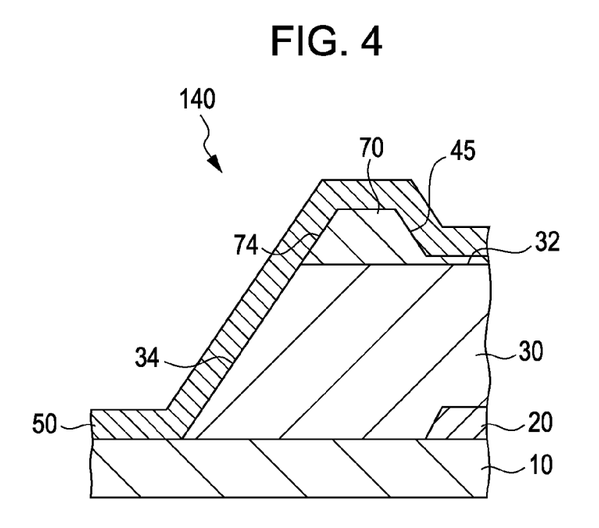
FIG. 4 is a schematic sectional view of a main portion of a piezoelectric element 140 according to a second modification.

FIG. 4 is a schematic sectional view of a main portion of a piezoelectric element 140 according to a second modification. Hereafter, in the piezoelectric element 140, components having substantially the same effect and function as components of the piezoelectric element 120 of the first modification are denoted by like reference numerals and detailed descriptions of such components are omitted.

The piezoelectric element 140 includes a conductive relaxing layer 70. The conductive relaxing layer 70 corresponds to, in the piezoelectric element 120, a single component including the third conductive layer 60 and the relaxing layer 40 that are composed of the same material. Accordingly, examples of a material of the conductive relaxing layer 70 include various metals such as nickel, iridium, and platinum.

The sectional shape of the conductive relaxing layer 70 is not particularly restricted; however, the shape is similar to that in the piezoelectric element 120 where the third conductive layer 60 and the relaxing layer 40 are formed as one component. In the example illustrated in FIG. 4, in the section of the conductive relaxing layer 70, a side surface 74 is inclined with respect to the top surface 32 of the piezoelectric layer 30. In addition, in the example illustrated in FIG. 4, the side surface 74 of the conductive relaxing layer 70 has the same inclination as the side surface 34 of the piezoelectric layer 30. Accordingly, the same advantageous effects as in the piezoelectric element 100 can be obtained in the piezoelectric element 140. As described in the description of the piezoelectric element 100 of the embodiment, the inclination of the side surface 74 may be made smaller than the inclination of the side surface 34 of the piezoelectric layer 30.

The piezoelectric element 140 of the second modification includes the conductive relaxing layer 70. Accordingly, the piezoelectric element 140 has not only the same features as in the piezoelectric element 120 but also a feature in which the conductive relaxing layer 70 can be formed by half-etching upon the production of the piezoelectric element 140. Accordingly, the production process of the piezoelectric element 140 can be made simple compared with the piezoelectric element 120.

When the conductive relaxing layer 70 is formed of a material having a water barrier property and the conductive relaxing layer 70 is formed so as to have an appropriate remaining film thickness, the conductive relaxing layer 70 functions as a fail-safe component and the processing shape of the conductive relaxing layer 70 is not necessary to be considered. Thus, the production process can be simplified.

Figure 5:
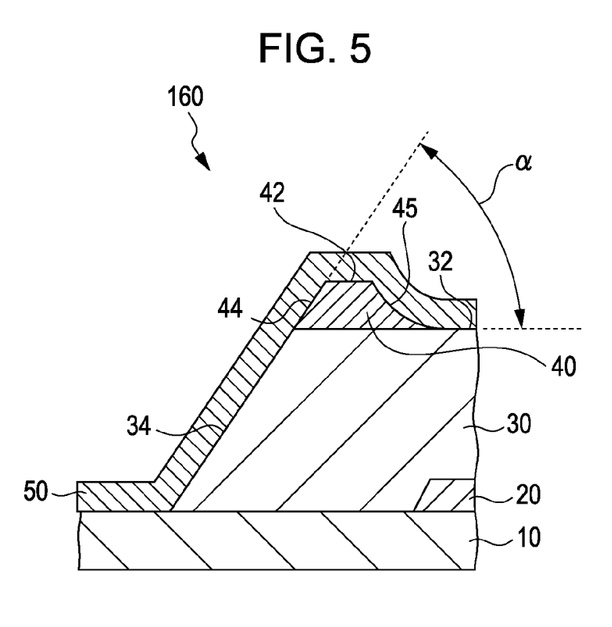
FIG. 5 is a schematic sectional view of a main portion of a piezoelectric element 160 according to a third modification.

FIG. 5 is a schematic sectional view of a main portion of a piezoelectric element 160 according to a third modification. Hereafter, in the piezoelectric element 160, components having substantially the same effect and function as components of the piezoelectric element 100 of the above-described embodiment are denoted by like reference numerals and detailed descriptions of such components are omitted.

In the piezoelectric element 160 according to the third modification, the second side surface 45 of the relaxing layer 40 is formed so as not to have a linear shape but a curved shape. This curve is recessed toward the relaxing layer 40 in section view. Specifically, the second side surface 45 of the relaxing layer 40 is more gently connected to the top surface 32 of the piezoelectric layer 30. Accordingly, in the piezoelectric element 160 according to the third modification, bending of the second conductive layer 50 in the thickness direction is considerably gentle in the edge portions where the second side surface 45 of the relaxing layer 40 and the top surface 32 of the piezoelectric layer 30 are connected to each other. In this configuration, generation of cracks in the second conductive layer 50 can be further suppressed in portions (edges of the top surface 32) where the top surface 32 and the side surface 34 of the piezoelectric layer 30 are connected to each other. Such a shape of the relaxing layer 40 can be formed by performing a liquid-phase processing (wet etching or the like) upon the formation of the relaxing layer 40.

Figure 6:
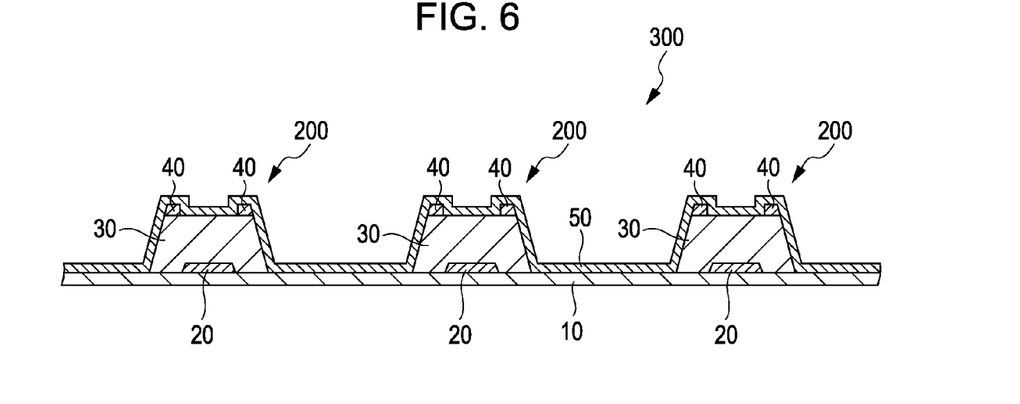
FIG. 6 is a schematic sectional view of a piezoelectric element 300 according to an embodiment.

In a piezoelectric element according to an embodiment of the invention, a plurality of multilayer structures 200 including the first conductive layer 20, the piezoelectric layer 30, the relaxing layer 40, and the second conductive layer 50 may be formed. FIG. 6 is a schematic sectional view of a piezoelectric element 300. Hereafter, in the piezoelectric element 300, components having substantially the same function as components of the piezoelectric element 100 are denoted by like reference numerals and detailed descriptions of such components are omitted.

As illustrated in FIG. 6, in the piezoelectric element 300, the first conductive layer 20, the piezoelectric layer 30, the relaxing layer 40, and the second conductive layer 50 constitute a multilayer structure 200 (may also be referred to as a multilayer structure component 200) and a plurality of the multilayer structures 200 are formed. In the example illustrated in FIG. 6, three multilayer structures 200 are formed; however the number of the multilayer structures 200 is not particularly restricted. Specifically, in the example illustrated in FIG. 6, the piezoelectric element 300 includes the plurality of first conductive layers 20, the plurality of piezoelectric layers 30, the plurality of relaxing layers 40, and the single second conductive layer 50. The second conductive layer 50 serves as a common upper electrode in the plurality of multilayer structures 200. It can also be said that the second conductive layer 50 continues through the plurality of multilayer structures 200. The second conductive layer 50 covers the plurality of relaxing layers 40, the plurality of piezoelectric layers 30, and the top surface of the substrate 10. The first conductive layers 20 are individual lower electrodes and are electrically separated form each other in the plurality of multilayer structures 200.

Since the piezoelectric element 300 includes the second conductive layer 50 serving as a common electrode, the piezoelectric element 300 has high reliability and the multilayer structures 200 can be highly densified (integrated). Thus, the piezoelectric element 300 is a piezoelectric element that is small and easy to produce.

Figure 7:
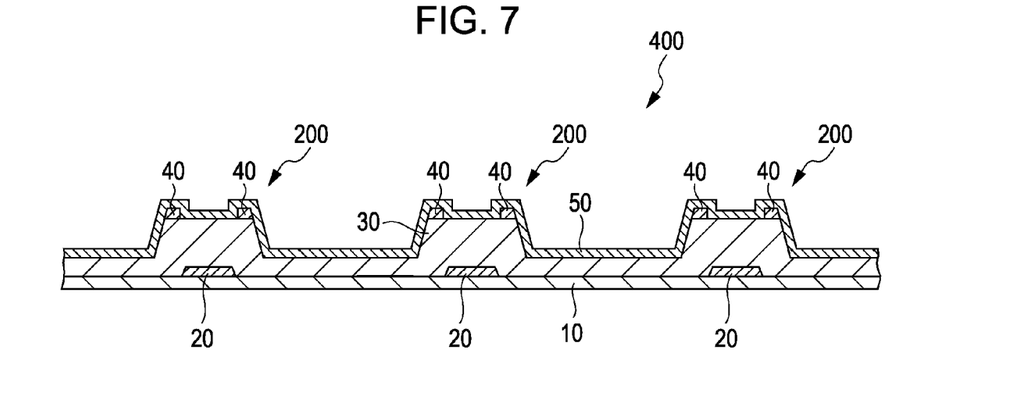
FIG. 7 is a schematic sectional view of a piezoelectric element 400 according to a fourth modification.

When a piezoelectric element according to an embodiment of the invention includes the plurality of multilayer structures 200, the following modification can be employed. FIG. 7 is a schematic sectional view of a piezoelectric element 400 according to a fourth modification. In the piezoelectric element 400, components having substantially the same function as components of the piezoelectric element 300 are denoted by like reference numerals and detailed descriptions of such components are omitted.

In the above-described example of the piezoelectric element 300, the second conductive layer 50 is a single continuous common electrode. As illustrated in FIG. 7, in the piezoelectric element 400, the piezoelectric layer 30 is further used as a common piezoelectric layer 30 through the plurality of multilayer structures 200. Specifically, the piezoelectric element 400 includes the plurality of first conductive layers 20, the single piezoelectric layer 30, the plurality of relaxing layers 40, and the single second conductive layer 50. It can also be said that the piezoelectric layer 30 continues through the plurality of multilayer structures 200. The second conductive layer 50 covers the plurality of relaxing layers 40 and the piezoelectric layer 30.

In the piezoelectric element 400, the second conductive layer 50 is not in contact with the substrate 10. Accordingly, when a vibrating plate that has flexibility is used as the substrate 10, by controlling the amount (thickness) of the piezoelectric layer 30 between the multilayer structures 200, for example, resonance frequency can be adjusted.

Figure 8:
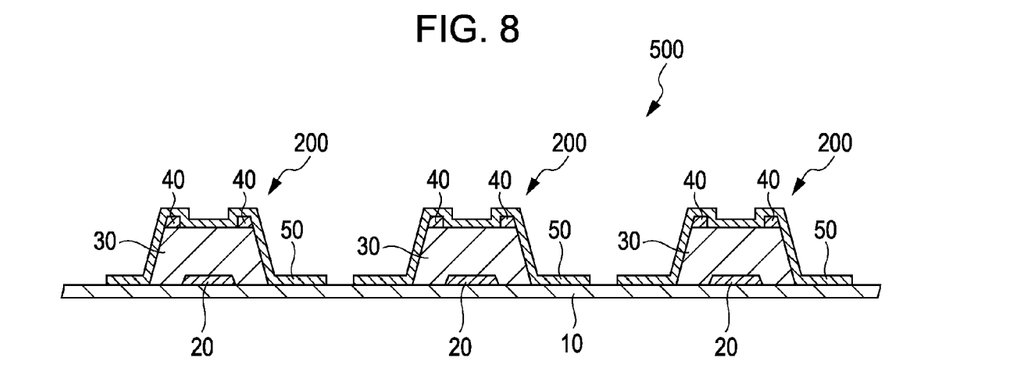
FIG. 8 is a schematic sectional view of a piezoelectric element 500 according to a fifth modification.

When a piezoelectric element according to an embodiment of the invention includes the plurality of multilayer structures 200, still another modification can be employed. FIG. 8 is a schematic sectional view of a piezoelectric element 500 according to a fifth modification. In the piezoelectric element 500, components having substantially the same function as components of the piezoelectric element 300 are denoted by like reference numerals and detailed descriptions of such components are omitted.

In the piezoelectric element 300 serving as an example, the second conductive layer 50 is a single continuous common electrode. As illustrated in FIG. 8, in the piezoelectric element 500, a plurality of second conductive layers 50 are provided so as to correspond to the plurality of piezoelectric layers 30. The plurality of second conductive layers 50 are electrically connected together via wiring (not shown) and serve as a common electrode.

In the piezoelectric element 500, interspaces are formed in the second conductive layers 50 between the multilayer structures 200. Accordingly, in neighboring multilayer structures 200, the influence (cross talk) of the driving of the piezoelectric layer 30 of one multilayer structure 200 on the driving of the piezoelectric layer 30 of the other multilayer structure 200 can be suppressed. Thus, the piezoelectric element 500 can have higher reliability.

3. Method for Producing Piezoelectric Element

Hereinafter, as to a method for producing a piezoelectric element, a method for producing the piezoelectric element 100 of the above-described embodiment will be described as an example with reference to drawings. FIGS. 9 to 12 are sectional views schematically illustrating production steps of the piezoelectric element 100.

Figure 9:
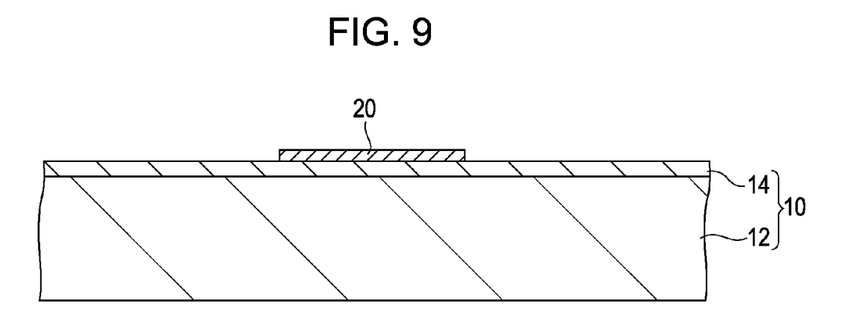
FIG. 9 is a schematic view illustrating a step for producing a piezoelectric element according to an embodiment.

As illustrated in FIG. 9, the first conductive layer 20 is formed on the substrate 10. In the example illustrated in FIG. 9, as the substrate 10, a silicon substrate 12 on which a zirconia layer 14 is formed is used. The first conductive layer 20 can be formed by, for example, a sputtering method, a plating method, or a vacuum deposition method. Specifically, the first conductive layer 20 can be formed by forming a conductive layer (not shown) on the entire surface of the substrate 10 and patterning the conductive layer.

Figure 10:
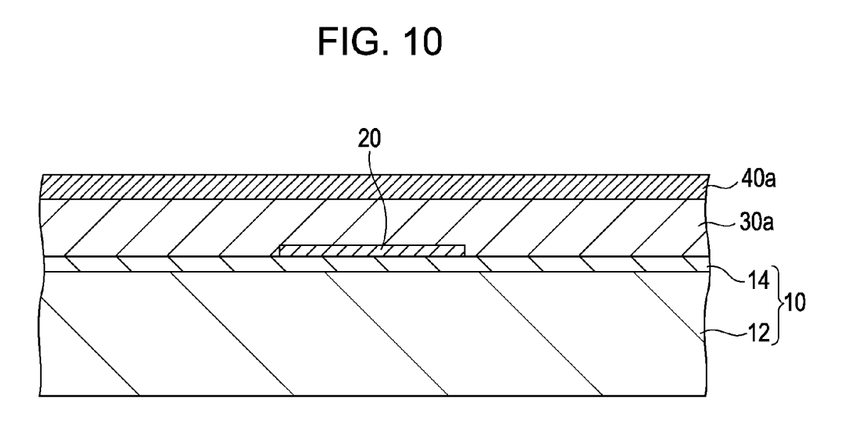
FIG. 10 is a schematic view illustrating a step for producing a piezoelectric element according to an embodiment.

As illustrated in FIG. 10, a piezoelectric layer 30a is subsequently formed on the entire top surface of the substrate 10 so as to cover the first conductive layer 20. As a result, the piezoelectric layer 30a is formed on the sides and the top of the first conductive layer 20. The piezoelectric layer 30a can be formed by, for example, a sol-gel process, a CVD (chemical vapor deposition) method, a MOD (metal organic deposition) method, a sputtering method, or a laser ablation method. When the material of the piezoelectric layer 30a is, for example, PZT, the piezoelectric layer 30a can be crystallized by annealing the piezoelectric layer 30a in an oxygen atmosphere at about 700° C. Note that the crystallization may be performed after the piezoelectric layer 30a is patterned.

Figure 11:
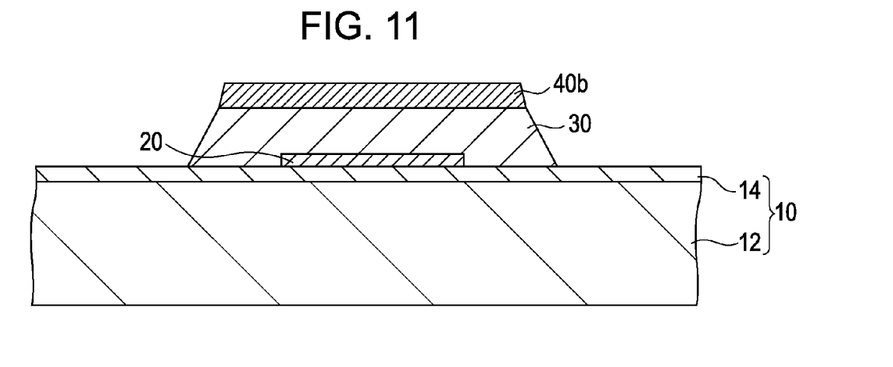
FIG. 11 is a schematic view illustrating a step for producing a piezoelectric element according to an embodiment.

A relaxing layer 40a is subsequently formed on the entire surface of the piezoelectric layer 30a by a sputtering method, a plating method, a vacuum deposition method, or the like. Then, a first patterning step is performed. As illustrated in FIG. 11, in the first patterning step, the relaxing layer 40a and the piezoelectric layer 30a are etched to form a multilayer structure including the first conductive layer 20, the piezoelectric layer 30, and a relaxing layer 40b. The etching in the first patterning step can be performed by, for example, dry etching using an apparatus generating high-density plasma such as inductively coupled plasma (ICP). When, in such a high-density plasma apparatus (dry etching apparatus), the pressure is set at 1.0 Pa or less, good etching can be performed. An etching gas for etching the relaxing layer 40a may be, for example, a gas mixture of a chlorine-based gas and argon gas. An etching gas for etching the piezoelectric layer 30a may be, for example, a gas mixture of a chlorine-based gas and a flon-based gas. Examples of the chlorine-based gas include $Cl_2$ and $BCl_3$. Examples of the flon-based gas include $C_4F_8$ and $CF_4$. When the piezoelectric layer 30a is etched with a gas mixture, the side surfaces 34 of the piezoelectric layer 30 can be made to have a footing shape. For example, the piezoelectric element 400 (in which the piezoelectric layer 30 is common through the plurality of multilayer structures 200) can be produced by using such formation of the footing shape in the side surfaces 34 of the piezoelectric layer 30.

Figure 12:
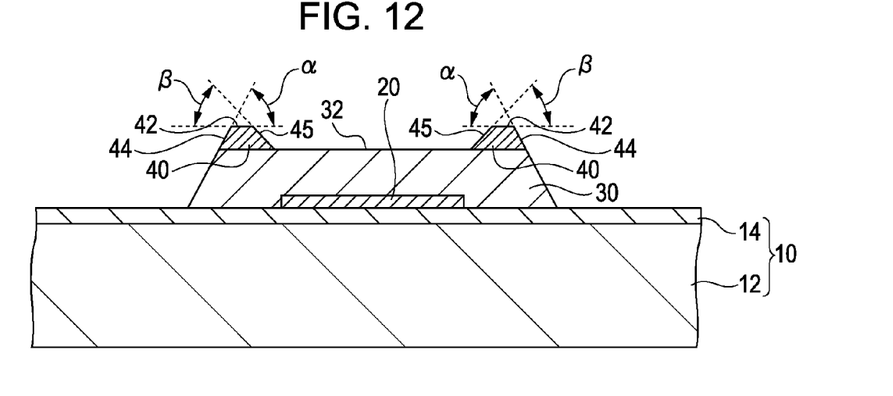
FIG. 12 is a schematic view illustrating a step for producing a piezoelectric element according to an embodiment.

Then, a second patterning step for patterning the relaxing layer 40b is further performed. As illustrated in FIG. 12, in the second patterning step, the relaxing layer 40b is patterned such that angle β between the second side surface 45 of the relaxing layer 40 and the top surface 42 of the relaxing layer 40 is smaller than angle α between the top surface 42 and the first side surface 44 of the relaxing layer 40 to expose the top surface 32 of the piezoelectric layer 30. As a result of the second patterning step, the relaxing layer 40 is formed. In the second patterning step, the relaxing layer 40 is formed as remaining portions along edges of the top surface 32 of the piezoelectric layer 30. In the patterning of a mask formed on the relaxing layer 40b in this step, alignment margin can be employed (not shown). The etching of the relaxing layer 40b can be performed in the same manner in which the relaxing layer 40a is etched in the first patterning step. Alternatively, the etching of the relaxing layer 40b can be performed by wet etching.

As illustrated in FIG. 1, the second conductive layer 50 is subsequently formed over the entire surface of the resultant member. The second conductive layer 50 can be formed by, for example, a sputtering method, a plating method, or a vacuum deposition method. If necessary, the second conductive layer 50 can be patterned.

As a result of the above-described steps, the piezoelectric element 100 can be produced.

The piezoelectric element 120 according to the first modification can be produced in, for example, the following manner. In the production steps of the piezoelectric element 100, the relaxing layer 40a is formed on the piezoelectric layer 30a. However, in the production of the piezoelectric element 120, a third conductive layer is formed on the piezoelectric layer 30a and the relaxing layer 40a is formed on the third conductive layer. The third conductive layer can be formed by, for example, a sputtering method, a plating method, or a vacuum deposition method. The subsequent steps can be substantially performed as in the production steps of the piezoelectric element 100. Thus, the piezoelectric element 120 according to the first modification can be produced. In the production steps of the piezoelectric element 120 according to the first modification, in the second patterning step, the third conductive layer can function as an etching stopper in the etching of the relaxing layer 40b. Accordingly, the piezoelectric element can be produced more readily. The piezoelectric element 160 according to the third modification can be produced in a manner similar to the method for producing the piezoelectric element 120 according to the first modification.

The piezoelectric element 140 according to the second modification can be produced in, for example, the following manner. In the production steps of the piezoelectric element 100, the relaxing layer 40a is formed on the piezoelectric layer 30a. However, in the production of the piezoelectric element 140, the relaxing layer 40a is formed with an electrically conductive material on the piezoelectric layer 30a. After that, in the second patterning step, the relaxing layer 40b is subjected to half etching. Other steps can be substantially performed as in the production steps of the piezoelectric element 100. Thus, the piezoelectric element 140 according to the second modification can be produced. Such production steps of the piezoelectric element 140 according to the second modification do not have the film-formation step of the relaxing layer 40a. Accordingly, the piezoelectric element 140 can be produced by fewer steps.

As described above, when a method for producing piezoelectric element according to an embodiment of the invention is employed, a piezoelectric element having high reliability in which concentration of residual stress is reduced can be readily produced.

4. Liquid Ejecting Head

Figure 13:
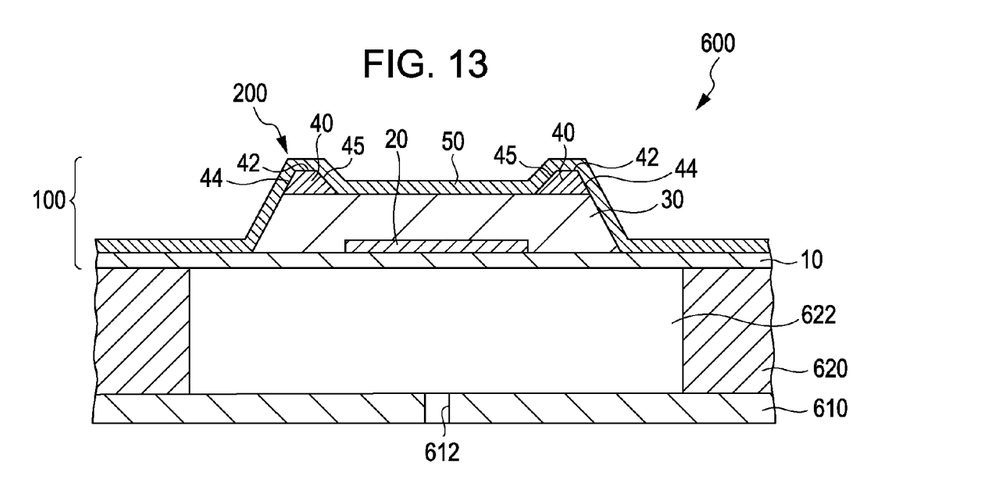
FIG. 13 is a schematic sectional view of a liquid ejecting head 600 according to an embodiment.
Figure 14:
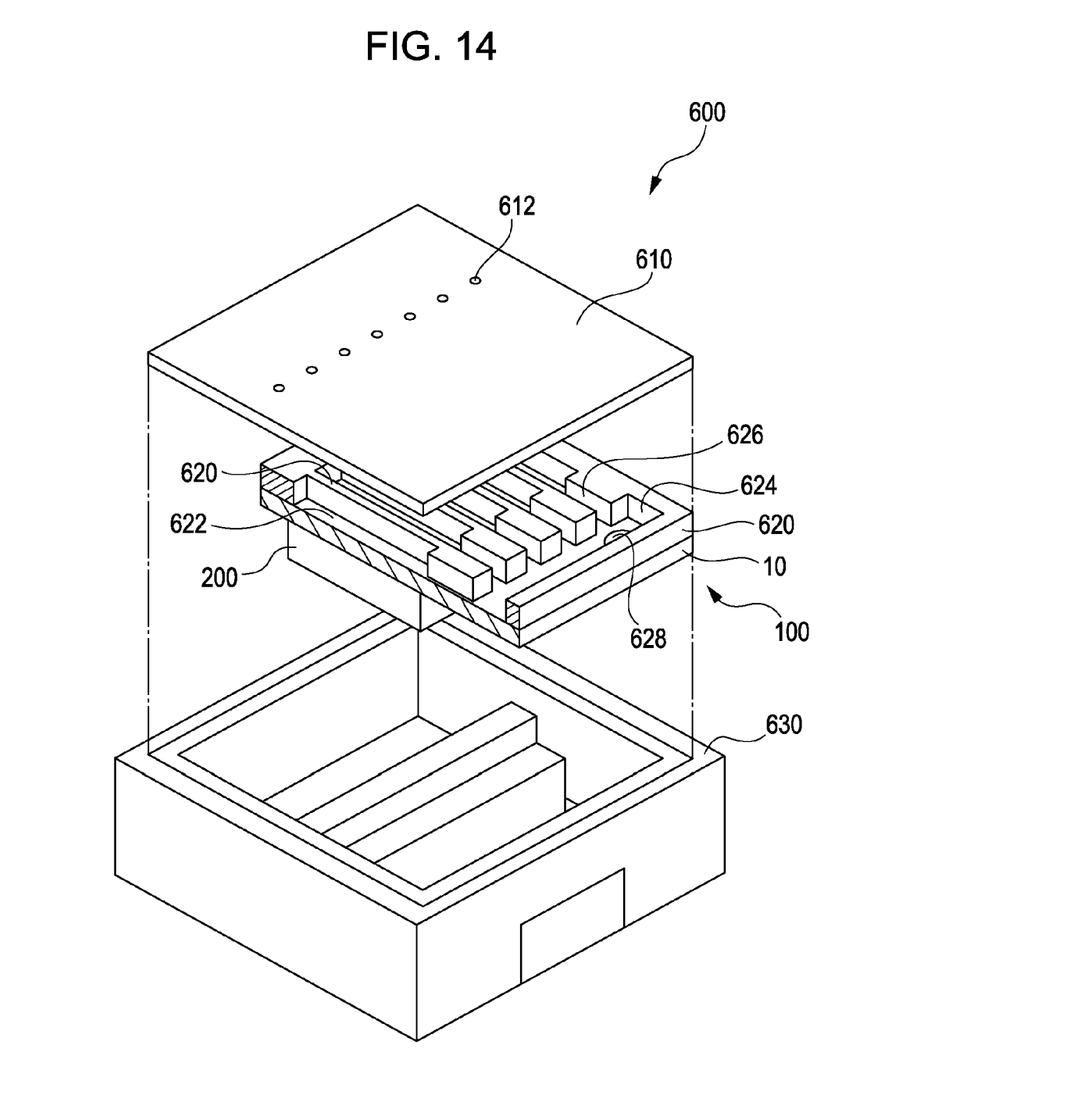
FIG. 14 is a schematic exploded perspective view of a liquid ejecting head 600 according to an embodiment.

Hereinafter, a liquid ejecting head 600 in which a piezoelectric element according to the invention functions as a piezoelectric actuator will be described with reference to drawings. FIG. 13 is a schematic sectional view of a main portion of the liquid ejecting head 600. FIG. 14 is a exploded perspective view of the liquid ejecting head 600 that is illustrated upside down.

The liquid ejecting head 600 can include the above-described piezoelectric element (piezoelectric actuator). In the following example, the liquid ejecting head 600 including the piezoelectric element 100 as a piezoelectric actuator will be described. As described above, when the piezoelectric element 100 functions as a piezoelectric actuator, the substrate 10 is a vibrating plate that has flexibility and is deformed by the action of the piezoelectric layer 30.

As illustrated in FIGS. 13 and 14, the liquid ejecting head 600 includes a nozzle plate 610 having nozzle openings 612, a pressure chamber substrate 620 in which pressure chambers 622 are formed, and the piezoelectric element 100. As illustrated in FIG. 14, the liquid ejecting head 600 may further include a casing 630. Note that, in FIG. 14, the illustration of the multilayer structure 200 of the piezoelectric element 100 is simplified.

As illustrated in FIGS. 13 and 14, the nozzle plate 610 has the nozzle openings 612. Ink can be ejected through the nozzle openings 612. In the nozzle plate 610, for example, a large number of the nozzle openings 612 are arranged in a line. The nozzle plate 610 is formed of a material such as silicon, stainless steel (SUS), or the like.

The pressure chamber substrate 620 is disposed on the nozzle plate 610 (under the nozzle plate 610 in the example illustrated in FIG. 14). The pressure chamber substrate 620 is formed of a material such as silicon. As illustrated in FIG. 14, by defining spaces between the nozzle plate 610 and the substrate 10 using the pressure chamber substrate 620, a reservoir (liquid storage section) 624, supply openings 626 in communication with the reservoir 624, and the pressure chambers 622 in communication with the supply openings 626 are provided. Specifically, the reservoir 624, the supply openings 626, and the pressure chambers 622 are defined by the nozzle plate 610, the pressure chamber substrate 620, and the substrate 10. The reservoir 624 can temporarily store ink supplied from outside (for example, an ink cartridge) via a through hole 628 formed in the substrate 10. The ink in the reservoir 624 can be supplied to the pressure chambers 622 via the supply openings 626. The volume of the pressure chambers 622 is changed by the deformation of the substrate 10. The pressure chambers 622 are in communication with the nozzle openings 612 and change in the volume of the pressure chambers 622 causes ejection of ink or the like through the nozzle openings 612.

The piezoelectric element 100 is provided on the pressure chamber substrate 620 (under the pressure chamber substrate 620 in the example illustrated in FIG. 14). The multilayer structure 200 of the piezoelectric element 100 is electrically connected to a piezoelectric element driving circuit (not shown) and can act (vibrate or deform) in accordance with signals from the piezoelectric element driving circuit. The substrate 10 is deformed by the action of the multilayer structure 200 (the piezoelectric layer 30) to appropriately change the internal pressure of the pressure chambers 622.

As illustrated in FIG. 14, the casing 630 can include the nozzle plate 610, the pressure chamber substrate 620, and the piezoelectric element 100. The casing 630 can be formed of, for example, a resin, a metal, or the like.

The liquid ejecting head 600 includes the above-described piezoelectric element 100, which is highly reliable. Accordingly, the liquid ejecting head 600 is also highly reliable.

In the above description, the case where the liquid ejecting head 600 is an ink jet recording head is described. However, a liquid ejecting head according to the invention can also be used as, for example, a colorant ejecting head used for producing color filters of liquid crystal displays or the like; an electrode material ejecting head used for forming electrodes of organic EL displays, field emission displays (FEDs), or the like; or a bioorganic material ejecting head used for producing biochips.

4. Liquid Ejecting Apparatus

Figure 15:
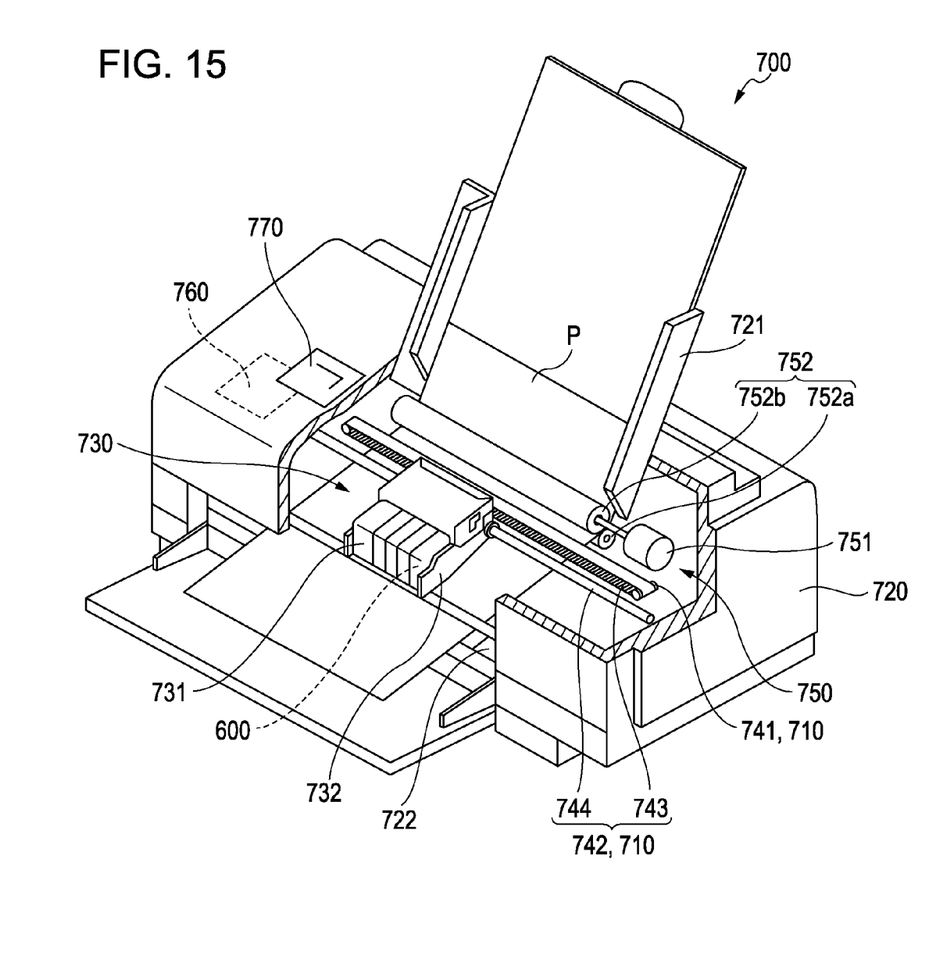
FIG. 15 is a schematic perspective view of a liquid ejecting apparatus 700 according to an embodiment.

Hereinafter, a liquid ejecting apparatus according to an embodiment of the invention will be described with reference to a drawing. FIG. 15 is a schematic perspective view illustrating a liquid ejecting apparatus 700 according to the embodiment. The liquid ejecting apparatus 700 includes a liquid ejecting head according to the invention. In the following description, a case where the liquid ejecting apparatus 700 is an ink jet printer including the above-described liquid ejecting head 600 will be described.

As illustrated in FIG. 15, the liquid ejecting apparatus 700 includes a head unit 730, a driving section 710, and a control section 760. The liquid ejecting apparatus 700 may further include an apparatus body 720, a paper sheet supply section 750, a tray 721 on which recording paper sheets P are placed, an ejection opening 722 for ejecting recording paper sheets P, and an operation panel 770 disposed on the top surface of the apparatus body 720.

The head unit 730 includes an ink jet recording head (hereafter, may be simply referred to as "head") constituted by the above-described liquid ejecting head 600. The head unit 730 further includes an ink cartridge 731 for supplying ink to the head and a carrying section (carriage) 732 on which the head and the ink cartridge 731 are mounted.

The driving section 710 can reciprocate the head unit 730. The driving section 710 includes a carriage motor 741 serving as a driving source of the head unit 730, and a reciprocating mechanism 742 configured to reciprocate the head unit 730 by the rotation of the carriage motor 741.

The reciprocating mechanism 742 includes a carriage guide shaft 744 both ends of which are supported by a frame (not shown), and a timing belt 743 extending in parallel with the carriage guide shaft 744. The carriage guide shaft 744 supports the carriage 732 such that the carriage 732 can be freely reciprocated. The carriage 732 is fixed to a portion of the timing belt 743. When the timing belt 743 is run by the action of the carriage motor 741, the head unit 730 reciprocates while being guided by the carriage guide shaft 744. During this reciprocation, ink is appropriately ejected from the head to perform printing on the recording paper sheet P.

The control section 760 can control the head unit 730, the driving section 710, and the paper sheet supply section 750.

The paper sheet supply section 750 can transport the recording paper sheet P from the tray 721 to the head unit 730 side. The paper sheet supply section 750 includes a paper sheet supply motor 751 serving as a driving source of the paper sheet supply section 750 and paper sheet supply rollers 752 rotated by the action of the paper sheet supply motor 751. The paper sheet supply rollers 752 include a driven roller 752a and a driving roller 752b that vertically face each other with a transporting path of the recording paper sheets P therebetween. The driving roller 752b is connected to the paper sheet supply motor 751. When the paper sheet supply section 750 is driven by the control section 760, the recording paper sheet P is transported so as to be passed under the head unit 730.

The head unit 730, the driving section 710, the control section 760, and the paper sheet supply section 750 are disposed inside the apparatus body 720.

The liquid ejecting apparatus 700 includes the liquid ejecting head 600, which is highly reliable. Accordingly, the liquid ejecting apparatus 700 is highly reliable.

In the above-described example, the case where the liquid ejecting apparatus 700 is an ink jet printer has been described. However, a liquid ejecting apparatus according to the invention can also be used as an industrial liquid ejecting apparatus. In this case, liquid (liquid material) ejected by such an apparatus may be, for example, a functional material that is adjusted to have an appropriate viscosity with a solvent or a dispersion medium.

The above-described embodiments and modifications are mere examples and the invention is not restricted thereto. For example, some of the embodiments and modifications can be appropriately employed in combination.

The invention is not restricted to the above-described embodiments and various modifications can be further employed. For example, the invention encompasses substantially the same configuration (for example, a configuration having the same function, method, and result or a configuration having the same object and advantageous effect) as the configurations described in the embodiments. In addition, the invention encompasses configurations in which nonessential components are replaced in the configurations described in the embodiments. In addition, the invention encompasses configurations that provide the same function and advantageous effects or can achieve the same object as the configurations described in the embodiments. In addition, the invention encompasses configurations in which the configurations described in the embodiments are combined with existing techniques.

What is claimed is:

1. A method for producing a piezoelectric element, comprising:
    forming a first conductive layer on or above a substrate;
    forming a piezoelectric layer on or above the first conductive layer;
    forming a relaxing layer on or above the piezoelectric layer;
    performing first patterning in which the relaxing layer and the piezoelectric layer are patterned;
    performing second patterning in which the patterned relaxing layer is further patterned; and
    forming a second conductive layer on or above the piezoelectric layer and the relaxing layer,
    wherein, in the second patterning, the relaxing layer is patterned so as to extend along an edge of a top surface of the piezoelectric layer.

* * * * *